United States Patent [19]
Timoc

[11] Patent Number: 6,002,270
[45] Date of Patent: Dec. 14, 1999

[54] SYNCHRONOUS DIFFERENTIAL LOGIC SYSTEM FOR HYPERFREQUENCY OPERATION

[75] Inventor: Constantin C. Timoc, La Canada, Calif.

[73] Assignee: Spaceborne, Inc., La/Canada, Calif.

[21] Appl. No.: 08/723,272

[22] Filed: Sep. 30, 1996

Related U.S. Application Data

[60] Provisional application No. 60/006,416, Nov. 9, 1995.

[51] Int. Cl.$^6$ .................. H03K 19/096; H03K 19/017
[52] U.S. Cl. ................. 326/98; 326/17; 326/28; 326/115; 327/55; 327/57
[58] Field of Search .................. 326/93, 95, 98, 326/115, 17, 27–28; 327/51, 54–55, 57; 365/205

[56] References Cited

U.S. PATENT DOCUMENTS

| | | | |
|---|---|---|---|
| 4,247,791 | 1/1981 | Rovell | 365/205 |
| 4,694,427 | 9/1987 | Miyamoto et al. | 365/205 |
| 5,144,162 | 9/1992 | Tran | 326/98 |
| 5,216,295 | 6/1993 | Hoang | 326/115 |
| 5,272,395 | 12/1993 | Vincelette | 327/51 |
| 5,583,456 | 12/1996 | Kimura | 326/115 |

*Primary Examiner*—Jon Santamauro
*Attorney, Agent, or Firm*—Christie, Parker & Hale, LLP

[57] ABSTRACT

A synchronous differential logic system is provided for implementation of pipelined computational structures capable of hyperfrequency operation. An individual logic circuit has a differential cascode switch and a synchronous sense amplifier which operates as a latch. A plurality of differential inputs are connected to the differential cascode switch which produces complementary signals at first and second nodes. The cascode switch is connected to the synchronous sense latch which provides complementary output signals of the logic circuit. The synchronous sense latch comprises an equalization transistor and two cross-coupled inverters, each connected to first and second power supply buses. The equalization transistor is connected to the first and second outputs, of the logic gate and to a global system clock. The two output signals of the logic circuit are forced by the equalization transistor to a voltage approximately equal to one half of the power supply voltage in one clock phase and are partially released by the equalization transistor in the second clock phase. The synchronous sense latch output is a function of the differential logic inputs applied to the cascode switch. High speed of operation is also accomplished by a) reducing logic signal voltage swings, b) using a synchronous sense latch which is not disconnected from the power supply during equalization, and c) forcing the terminals of each bistable circuit to a substantially sensitive operating point which is one half of the power supply voltage, before the bistable circuit switches to valid logic levels.

37 Claims, 5 Drawing Sheets

| FUNCTION | CONNECTION | |
|---|---|---|
| X AND Y | X to 41<br>Y to 39, 43 | X̄ to 42<br>Ȳ to 38, 40 |
| X OR Y | X to 39<br>Y to 41, 43 | X̄ to 38<br>Ȳ to 42, 40 |
| X EXCLUSIVE-OR Y | X to 38, 41<br>Y to 40 | X̄ to 39, 42<br>Ȳ to 43 |
| MULTIPLEXER WITH SELECTOR S AND INPUTS X, Y | S to 40<br>X to 39<br>Y to 42 | S̄ to 43<br>X̄ to 38<br>Ȳ to 41 |

SYNCHRONOUS DIFFERENTIAL LOGIC SYSTEM FOR HYPERFREQUENCY OPERATION

REFERENCE TO RELATED APPLICATION(S)

This application is a non provisional application based upon and claims benefit of U.S. Provisional Application No. 60/006,416 filed Nov. 9, 1995.

BACKGROUND OF THE INVENTION

A. Field of the Invention

This invention relates to logic systems and more particularly to synchronous differential logic circuits for very large scale integrated systems which operate at very high frequency.

B. Background Art

Advanced CMOS fabrication technologies are capable of producing VLSI systems comprising millions of transistors and wires. However, CMOS has yet to be exploited to its full potential for manufacturing not only complex but also high performance VLSI systems.

Efforts toward improving VLSI system performance have proceed on all levels including improvements in architecture and logic circuits. At the architectural level the press for increased performance has led to the development of two forms of concurrency—parallelism and pipelining. Parallelism emphasizes concurrency by replicating a hardware structure many times. Pipelining takes the approach of providing combinational logic structures with clocked data latches to hold intermediary results so that the processing of one data set can be performed concurrently with the processing of other data sets. As the number of logic levels interposed between successive clocked latches decreases, the pipelined system could be operated at higher clock frequencies and thus the amount of work performed concurrently could be increased. However, the implementation of high performance maximally pipelined systems has not been commercially viable because of the relatively high incremental cost of data latches.

At the circuit level, the development of logic gates having shorter switching times, hence permitting operation of VLSI systems at higher clock frequencies has been a constant goal. The major improvements in logic circuits performance has been due to advances in CMOS fabrication technologies which produced transistors with higher gain per chip area and interconnections with less parasitic capacitance and resistance between logic circuits. However, little improvement in circuit performance has come from new types of CMOS logic gates.

There are two types of logic circuits which are used in digital VLSI systems, i.e., single-ended and differential. Single-ended CMOS logic circuits are characterized by having a single current path between a power supply bus and ground and by the use of a single signal conductor to connect the output of one gate to the input of another gate. During the transition period from one logic level to the opposite one, single-ended CMOS circuits are known to generate a significant amount of switching noise. The problem is further exacerbated by an occasional simultaneous switching of a group of single-ended off-chip drivers which alter the current demand on the power supply thus causing an instantaneous voltage collapse. This type of noise which depends on the data being processed by the VLSI system is difficult or impossible to filter out due to its low frequency of occurrence. Moreover, switching noise can affect the correct operation of other gates and consequently limits the upper clock frequency of such systems.

A differential logic gate has two current paths between the power supply buses. One current path produces a logic value at one output while, simultaneously, the other current path produces its logic complement at the other output. A differential logic system uses two wires for each signal connected from a differential output of one gate to a differential input of another gate. Logic values in a differential logic system are defined as the algebraic voltage difference between the two complementary signal wires. Differential circuits could be less sensitive to noise, signal line voltage drops, and power supply variations, than single-ended circuits.

A differential logic gate comprises a differential switch and a load circuit. A plurality of differential inputs are connected to the differential switch which provides a path to ground, only on one of its two outputs, as a function of the logic values of the inputs. (The differential switch is a single pole double throw switch implemented with transistors and controlled by one or more differential inputs.) The load circuit senses the current into the outputs of the differential switch and produces a given output signal at a first output node and a second output signal, which is the complement of that of the given output signal, at a second output node.

There is a class of differential circuits that use load circuits which are controlled by a clock. In these synchronous circuits, both differential outputs are precharged in one phase of the clock to a given voltage and in a second phase of the clock, the inputs are evaluated to provide a logic value at the outputs which is a Boolean function of the inputs.

Synchronous differential logic circuits suitable for implementing pipelined VLSI systems have been known in the prior art. Applicants believe that the invention, as set forth herein, has many significant advantages over the circuits of the prior art, especially when ones purpose is to produce useful maximally pipelined systems which are to operate at a much higher frequency than the prior art system. Although none of the prior art known to the applicants teaches or suggests applicants' invention, the closet reference is described as follows.

A synchronous, latched, differential CMOS logic circuit was described by T. A. Grotjohn and B. Hoefflinger in an article entitled "Sample-Set Differential Logic (SSDL) for Complex High-Speed VLSI," in Journal of Solid-State Circuits, vol. SC-21, No. 2, pp. 367–369, April 1986.

BRIEF DESCRIPTION OF THE INVENTION

In view of the disadvantages of the referenced prior art, it is a principal object of the invention to provide a synchronous differential circuit capable of performing simultaneously both a logic function and a clocked data latching function.

Another object of the invention is to provide a synchronous differential logic circuit in which the logic function is inseparable from the clocked data latching function.

Yet another object of the invention is to provide a synchronous differential logic circuit with substantially shorter switching time and operating at a higher clock frequency than has heretofore been possible.

Another object of the invention is to provide a differential logic system wherein the load on the power supplies is essentially constant.

Yet another object of the invention is to provide a logic system in which the switching noise on power supply buses is at the clock frequency with no lower frequency components.

A synchronous differential logic system is provided for hyperfrequency operation. An individual logic circuit has a differential switch and a synchronous sense latch. A plurality of differential inputs are connected to the differential switch which produces a given output signal at a first output node and a second output signal which is the complement of that of the given output signal, at a second output node. The first and the second outputs from the differential switch are connected to a first and second terminals of the synchronous sense latch, respectively. The terminals of the synchronous sense latch, which are complements of each other, form the differential output of the logic circuit. The synchronous sense latch further comprises two cross-coupled inverters and an equalization transistor. The cross-coupled inverters have a third terminal connected to a first power supply bus and a fourth terminal connected to a second power supply. The equalization transistor has a first terminal connected to the first output of the logic gate, a second terminal connected to the second output of the logic gate, and a third terminal (gate) connected to a global system clock signal.

In one phase of the clock, the two output signals of the logic circuit are forced by the equalization transistor to a voltage approximately equal to one half of the power supply voltage. On a second phase of the clock the outputs of the logic gate are partially releases by the equalization transistor and the sense latch produces a differential output which is a function of the differential logic inputs applied to the differential switch.

The preferred embodiment hereinafter described shows how a logic circuit and a clocked latching sense amplifier are combined in an inseparable structure to perform simultaneously a latched logic function. This combination of previously separate functions (logic and latching) permits an increase in operating clock frequency.

Operation of the preferred embodiment at higher clock frequency than heretofore possible is further accomplished by (a) reducing the voltage swing of the logic signals, (b) using a sense amplifier which is not disconnected from the power supply during equalization, and (c) forcing the terminals of each sense amplifier to a substantially sensitive operating point which is approximately one half of the power supply voltage, before the latched logic circuit switches to valid logic levels.

Since the transistors of the sense amplifier are not completely turned on or off but instead are switched from a more conductive to a less conductive condition by the equalization transistor, the load on the power supply appears essentially constant and the switching noise due to charge-reversing of parasitic capacitances is substantially reduced. There is only a small amount of switching noise present on the power supply buses which is at the clock frequency and which can easily be filtered out with small capacitors located adjacent to the logic circuit.

The foregoing and other objects, features, and advantages of the invention will be apparent from the more particular description of the preferred embodiments of the invention, as illustrated in the accompanying drawings.

BRIEF DESCRIPTION OF THE DRAWING

This invention may be more clearly understood with the following detailed description and by reference to the drawings in which.

In the drawings identical elements in different specific embodiments are designated by identical reference numbers.

Detailed Description of the Invention

A. General Description of the Logic Circuit

Figure 1:
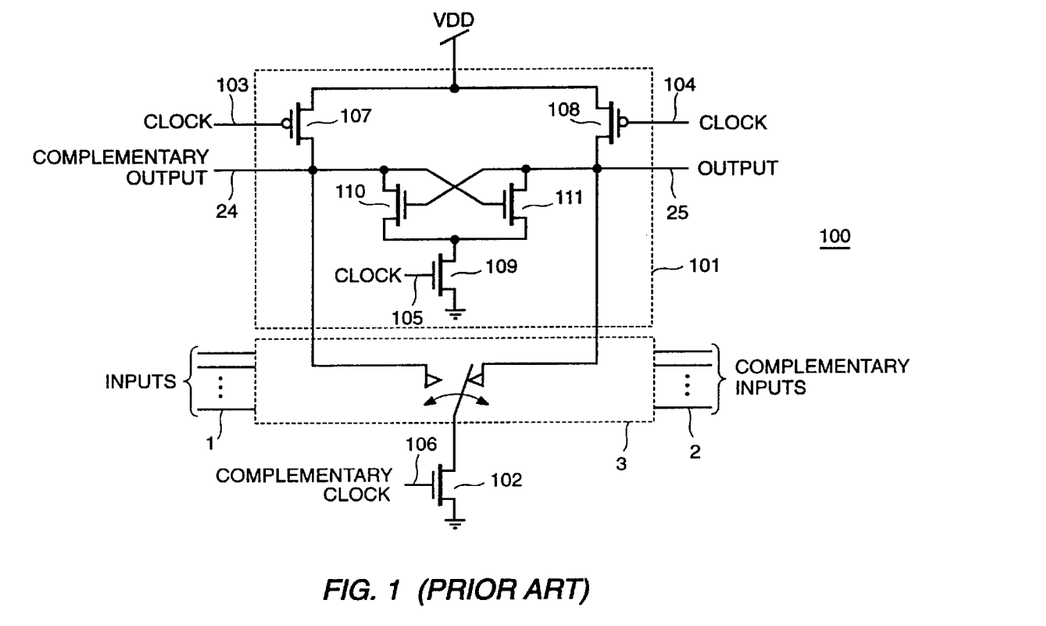
FIG. 1 illustrates a prior art synchronous latched differential CMOS circuit.

A schematic of the prior art Grotjohn-Hoefflinger circuit is shown in FIG. 1. The circuit 100 consists of a differential switch 3, a synchronous latching sense amplifier 101, a grounding transistor 102, clock inputs (103, 104, 105, and 106), data inputs (1 and 2), data outputs (24 and 25), and a power supply lines VDD and ground. The operation of the Grotjohn-Hoefflinger circuit consists of a sample phase and a set phase. During the samples phase the clock inputs (103, 104, and 105) are low, the complementary clock input 106 is high and thus transistors 107, 108, and 102 are turned on. A path exists from either 24 or 25 to ground through one side of the differential switch only. The result is that either node 24 or 25 will be at the voltage VDD and that the other node will be at a voltage less than VDD. The next phase of the operation is the set phase where 107, 108, and 102 are off and the sense amplifier portion of the circuits is turned on through 109 and either 110 or 111. Either node, 24 or 25, at the lower voltage is now discharged to ground. The discharge through transistors 110 or 111 and 109 is more rapid than through differential switch 3 because of the large drive capabilities of the sense amplifier circuit. The transition is also assisted by the differential gain of the sense amplifier. In conclusion, the Grotjohn-Hoefflinger circuit allows complex random logic to be performed at a higher clock frequency than prior art circuits without a sense amplifier.

There are many disadvantages of the referenced prior art synchronous differential logic circuit. First, the sense amplifier 101 is biased, during the sample phase at a precharge voltage close to VDD, which is not its most sensitive operating point. Second, the discharge time of either node 24 or 25 from the voltage at which these nodes are precharged to ground is much longer than if the precharge voltage would have been only half of the VDD voltage. Third, significant amount of time is wasted in the process of connecting and disconnecting the sense amplifier 101 and the differential switch 3 from ground via transistors 109 and 102, respectively.

Figure 2:
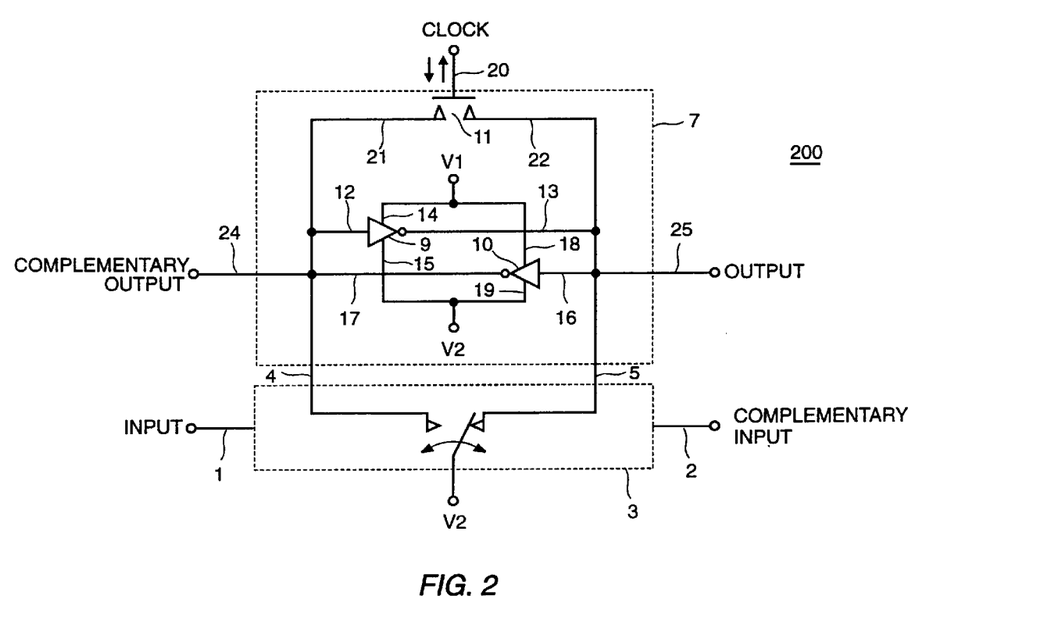
FIG. 2 illustrates the preferred embodiment of the logic circuit of the invention comprising a differential switch and a synchronous sense latch.

Shown in FIG. 2 is a preferred embodiment of the invention which is a synchronous differential logic (SDL) circuit 200 having differential inputs, a differential switch, a synchronous sense latch, differential outputs, a clock input, and two power supply ports. The differential inputs include an input 1 and a complementary input 2. The differential switch 3 (represented as a single-pole double-throw switch) receives the differential inputs on terminals 1 and 2, and provides only one electrically conductive path from either port 4 or port 5 to a power supply port V2. Ports 4 or 5 are connected to port V2 as specified by a Boolean function implemented in the differential switch 3 and by the logic values at inputs 1 and 2. The synchronous sense latch 7 has data inputs 4 and 5, clock input, a data output 25 and complementary data output 24. The synchronous sense latch 7 further comprises inverters 9 and 10, and transistor 11 (represented as a momentary switch). The inverter 9 has an input 12, an output 13, and ports 14 and 15. The inverter 10 has an input 16, an output 17, and two ports 18 and 19. The transistor 11 has control input (gate), and two terminals 21 and 22. Ports 14 and 18 are connected to power supply port V1 and ports 15 and 19 are connected to power supply port V2. Inverters 9 and 10 are cross-coupled, input 12 is connected to output 17 and input 16 is connected to output 13. In reference to transistor 11, the terminal 21 is connected to input 12, the terminal 22 is connected to input 13, and the control input (gate) 20 is connected to a clock signal. Inverter output 17 is one of the differential outputs of the synchronous differential logic circuit 200 labeled complementary output 24, and inverter output 13 is the other output of logic circuit 200 labeled output 25.

In operation, the SDL circuit 200 is provided with a voltage V1 and with a voltage V2. Voltage V1 is positive in respect to V2 and any one of these voltages might be connected to ground. In one phase, circuit 200 is equalized when the clock signal applied to the gate of transistor 11 is high (closes the switch) and in another phase it is evaluated when the clock is low (opens the switch). In the equalization phase, both outputs 24 and 25 are forced by the transistor 11 to a voltage which approximately equal to one half of the power supply voltage. During the equalization phase, the differential inputs 1 and 2 are allowed to change and the differential switch 3 closes either path 4 or path 5 to V2. When the differential inputs 1 and 2 are such that the differential switch closes path 5 to V2 and leaves path 4 open then, when the clock change from equalization to evaluation, the output 25 will be pulled down toward V2 and the output 24 will be pulled up toward V1. The size (width and length) of equalization transistor 11 is purposely selected such that when circuit 200 operates at its maximum frequency, the voltages at 24 and 25 are not released to reach either voltage V1 or voltage V2. Moreover, the size of equalization transistor 11 is selected such that at the maximum operating frequency, the other transistors of logic circuit 200 are switched between a less-conducting and a more-conducting condition instead of being switched between an off (non-conducting) and an on (conducting) condition, as in the referenced prior art.

A multistage pipelined system would be implemented with SDL circuits by employing complementary clocks on successive stages such that consecutive stages will be in alternating equalization and evaluation phases. It is worth noting that although the synchronous sense latch amplifier 7 is provided primarily to decrease the switching time of the circuit 200, it has the additional benefit of operating as a clocked data latch in a pipelined system.

Figure 3:
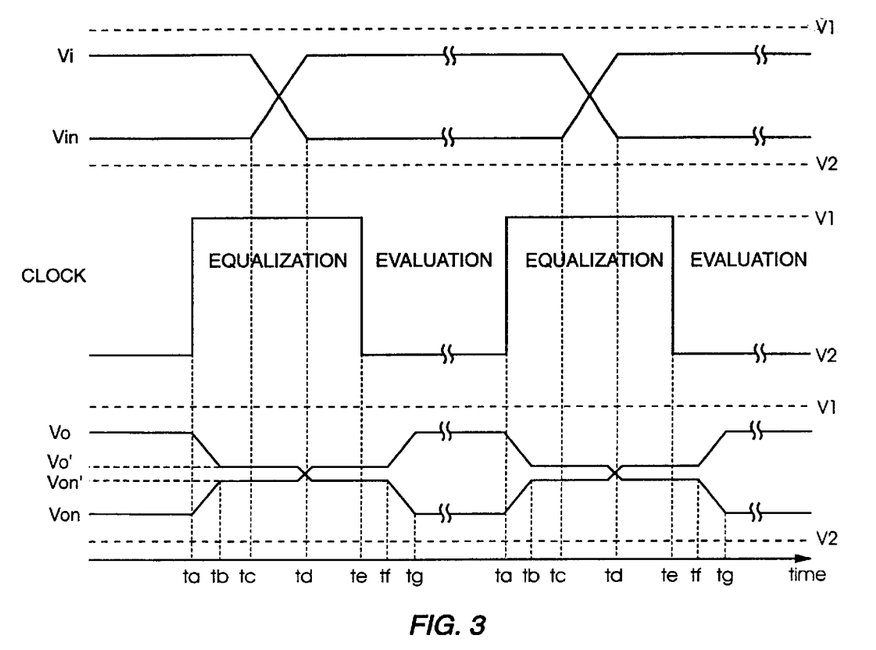
FIG. 3 is a timing diagram depicting voltage levels at different points during operation of the circuit shown in FIG. 2.

FIG. 3 shows the timing diagram during the operation of the logic circuit in FIG. 2. The operation of the circuit 200 is defined by the voltage level of the CLOCK signal into two phases: an equalization phase and an evaluation phase.

At the beginning of the equalization phase (ta), the CLOCK signal turns on the transistor 11 and establishes a current path between the outputs 25 and 24. As a result, at time tb, the outputs 25 and 24 of the logic circuit 200 attain voltage level Vo' and Von'. Ideally, Vo' and Von' would both equal to one-half of the voltage difference between V1 and V2. However, because of the voltage drop across the transistor 11, there is a small voltage difference between Vo' and Von'.

At time tc inputs 1 and 2 of the differential switch 3 begin to change. In response to the changes at inputs 1 and 2, the current path between one of the output node 25 and 24 and the voltage supply V2 begins to close and the other one begins to open. Assume for purposes of illustration that the path between output node 25 and V2 closes and the path between output node 24 and V2 opens. As a result, at time td, after some delay, the outputs cross but are not released to valid logic levels because the equalization transistor 11 is still conducting, output 25 is pulled down, forcing the output 24 to go up.

At time te, the voltage level of the CLOCK signal goes low and the logic circuit 200 enters the evaluation phase. After some delay, at time tf, outputs 25 and 24 start to move to their respective stable states. At time tg, output 25 is latched at a stable low output voltage level and the output 24 is latched at a stable high output voltage level. The propagation delay of the circuit 200, i.e., the delay from the moment in which the input changes, to the moment in which the output changes, is the difference between tg and td.

B. Detailed Description of Logic Circuits

1. SDL Data Latch

Figure 4:
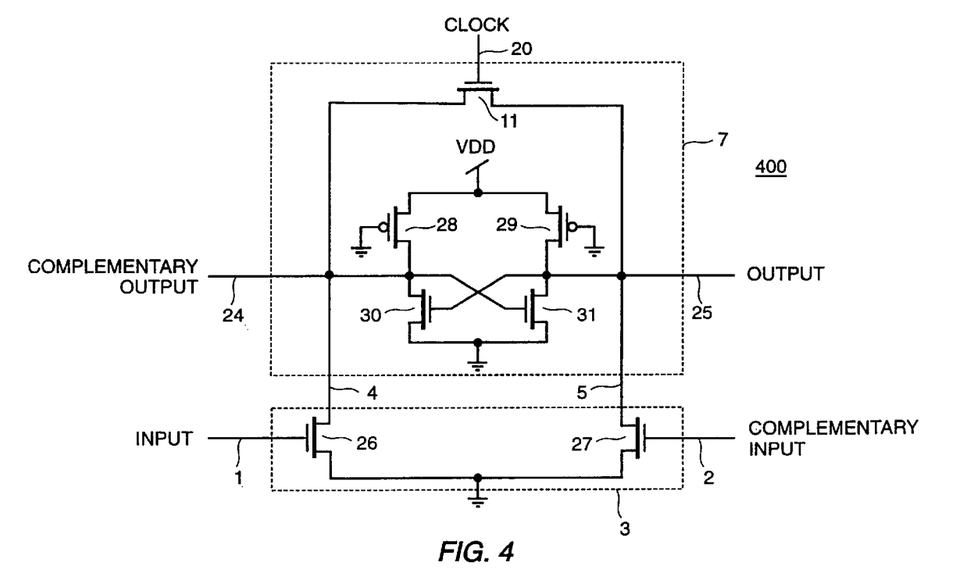
FIG. 4 shows an example of a latch comprising a differential switch and a synchronous sense latch.

Referring to FIG. 4, a preferred embodiment of a SDL data latch 400 implemented is shown. In the preferred embodiment of the SDL data latch, the differential switch 3 is implemented with two NFETs (n-channel field effect transistors) 26 and 27, and the cross-coupled inverters in the synchronous sense latch 7 is implemented with NFETs 30 and 31, and PFETs (p-channel field effect transistors) 28 and 29. The equalization transistor is the NFET 11. The supply voltage V2 is connected to ground and V1 is a positive voltage labeled VDD. It is worth noting that all FETs have a fourth terminal which is known in the prior art as body. Herein, the bodies of all PFETs are connected (not shown) to the power supply bus VDD and the bodies of all NFETs are connected (not shown) to the ground.

In operation, the SDL latch 400 is provided with a voltage VDD and with a ground connection. Voltage VDD is positive in respect to the ground. In one phase, circuit 400 is equalized when the CLOCK signal applied to the gate of transistor 11 is high and in another phase it is evaluated when the clock is low. In the equalization phase, both outputs 24 and 25 are forced by the transistor 11 to a voltage which approximately equal to one half of the power supply voltage. During the equalization phase, the differential inputs 1 and 2 are allowed to change and the differential switch 3 closes either path 4 or path 5 to the ground. When the differential inputs 1 and 2 are such that the differential switch closes path 5 to the ground and leaves path 4 open then, when the CLOCK change from equalization to evaluation, the output 25 will be pulled down toward the ground and the output 24 will be pulled up toward VDD. The size (width and length) of equalization transistor 11 is purposely selected such that when circuit 400 operates at its maximum frequency, the voltages at 24 and 25 are not released to reach either voltage VDD or the ground. Moreover, the size of equalization transistor 11 is selected such that at the maximum operating frequency, the other transistors of logic circuit 400 are switched between a less-conducting and a more-conducting condition instead of being switched between an off (non-conducting) and an on (conducting) condition, as in the referenced prior art.

2. SDL Two-Way Multifunction Circuit

Figure 5:
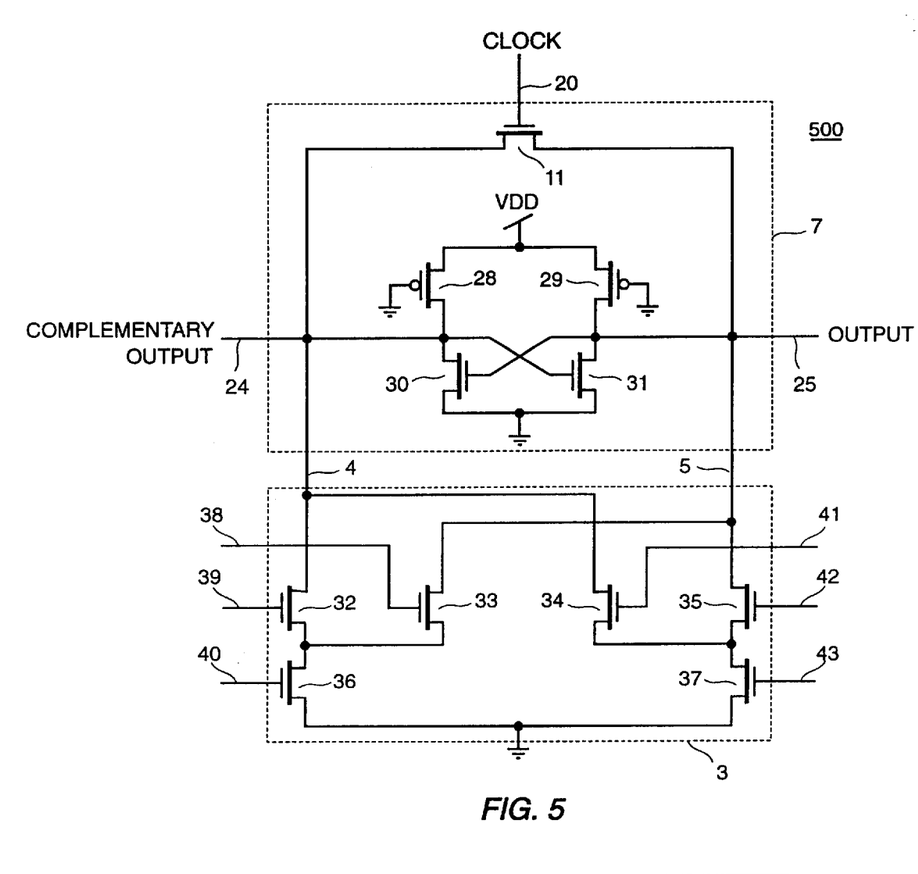
FIG. 5 shows an example of the logic circuit that can perform the function AND/NAND, OR/NOR, or XOR/XNOR, comprising a differential switch and a synchronous sense latch.
Figure 8:
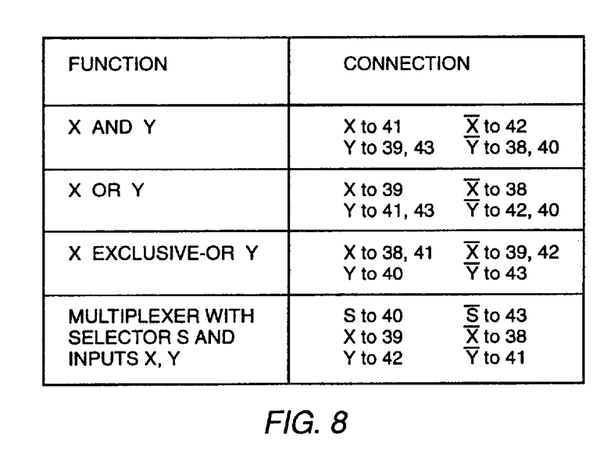
FIG. 8 describes the different logic functions that can be performed by the differential switch of FIG. 5.

Referring to FIG. 5, a preferred embodiment of an SDL two-way multifunction 500 is shown. In logic circuit 500, the differential switch 3 is implemented with six NFET transistors 32, 33, 34, 35, 36, and 37, and the cross-coupled inverters in the synchronous sense latch 7 are implemented with PFETs 28 and 29, and NFETs 30 and 31. The equalization transistor is a NFET 11. The symmetrical differential switch of this preferred embodiment can perform the following two-input functions: a) AND/NAND, b) OR/NOR, c) EXCLUSIVE-OR/EXCLUSIVE-NOR, and d) two-to-one MULTIPLEXER. FIG. 8 shows different ways of connecting the input variables X and Y to the inputs of the differential switch 3 in order to perform different functions.

In operation, the SDL circuit 500 is provided with a voltage VDD and with a ground. Voltage VDD is positive at in respect to the ground. In one phase, circuit 500 is equalized when the clock signal applied to the gate of transistor 11 is high and in another phase it is evaluated when the clock is low. In the equalization phase, both outputs 24 and 25 are forced by the transistor 11 to a voltage which approximately equal to one half of the power supply voltage. During the equalization phase, the differential inputs 38, 39, 40, 41, 42, and 43 are allowed to change and the differential switch 3 closes either path 4 or path 5 to the ground. When the differential inputs are such that the differential switch closes path 5 to the ground and leaves path 4 open then, when the clock change from equalization to evaluation, the output 25 will be pulled down toward the ground and the output 24 will be pulled up toward VDD. The size (width and length) of equalization transistor 11 is purposely selected such that when circuit 500 operates at its maximum frequency, the voltages at 24 and 25 are not released to reach either voltage VDD or the ground. Moreover, the size of equalization transistor 11 is selected such that at the maximum operating frequency, the other transistors of logic circuit 500 are switched between a less-conducting and a more-conducting condition instead of being switched between an off (non-conducting) and an on (conducting) condition, as in the referenced prior art.

C. General Description of the Input and Output Circuits

Figure 6:
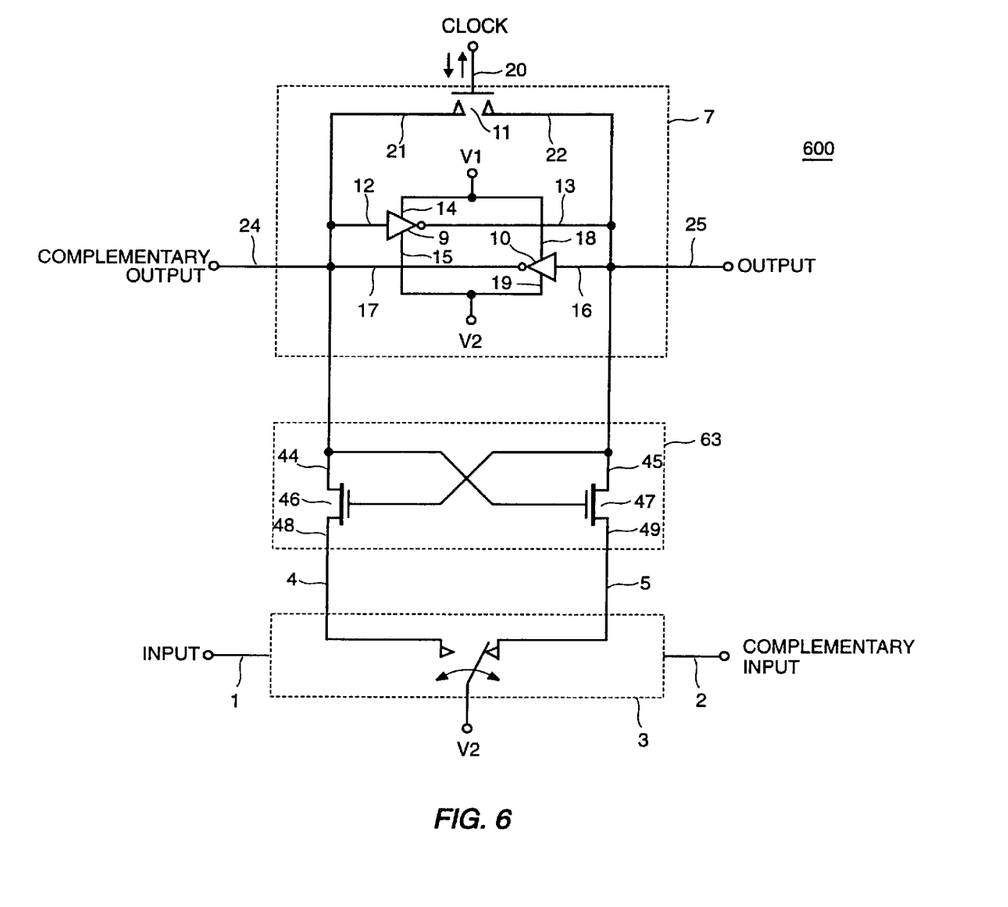
FIG. 6 illustrates the preferred embodiment of an input and output circuit of the invention comprising an off-chip driver and an off-chip receiver.

Referring to FIG. 6, it illustrates a combination of SDL driver and receiver pair 600. The circuit 600 has a differential switch 3 (shown as a single pole double throw switch) performing the function of a driver, and a receiver composed of an isolation circuit 63, and a synchronous sense latch 7. The circuit 600 further comprises an input 1, a complementary input 2, an output 25, a complementary output 24, a clock input 20, and two power supply ports V1, V2. It is worth noting that all FETs have a fourth terminal which is known in the prior art as body. Herein, bodies of all PFETs are connected (not shown) to power supply port V1 and bodies of all NFETs are connected (not shown) to power supply port V2.

The differential switch 3 of FIG. 6 is identical in configuration to the differential switch 3 of FIG. 2. The isolation circuit 63 comprises two NFET transistors 46 and 47 and a set of inputs 48, 49 and a set of outputs 44, 45. The output 44 is connected to a control input (gate) of the transistor 47 and the output 45 is connected to a control input (gate) of the transistor 46. The sense latch 7 of FIG. 6 has the same configuration as that of the sense latch 7 shown in FIG. 2.

In operation, the SDL circuit 600 is provided with a voltage V1 and with a voltage V2. Voltage V1 is positive in respect to V2 and any one of these voltages might be connected to ground. In one phase, circuit 600 is equalized when the clock signal applied to the gate 20 of transistor 11 (shown as a momentary switch) is high (closes the momentary switch) and in another phase it is evaluated when the clock is low (opens the momentary switch). In the equalization phase, both outputs 24 and 25 are forced by the transistor 11 to a voltage which approximately equal to one half of the power supply voltage and transistors 46 and 47 are both conducting. During the equalization phase, the differential inputs 1 and 2 are allowed to change and the differential switch 3 closes either path 4 or path 5 to V2. When the differential inputs 1 and 2 are such that the differential switch closes path 5 to V2 and leaves path 4 open then, when the clock change from equalization to evaluation, the output 25 will be pulled down toward V2 and the output 24 will be pulled up toward V1. Moreover, transistor 47 will conduct more current than transistor 46. The size (width and length) of equalization transistor 11 is purposely selected such that when circuit 600 operates at its maximum frequency, the voltages at 24 and 25 are not released to reach either voltage V1 or voltage V2. Moreover, the size of equalization transistor 11 is selected such that at the maximum operating frequency, the other transistors of logic circuit 600 are switched between a less-conducting and a more-conducting condition instead of being switched between an off (non-conducting) and an on (conducting) condition, as in the referenced prior art.

The isolation circuit 63 reduces the voltage swing at nodes 4, 5 while allowing a larger voltage swing at ports 24 and 25. Thus nodes 4, 5 could operate at high frequency even in the presence of heavy capacitance or over controlled impedance transmission lines.

D. Detailed Description of the Input and Output Circuits

Figure 7:
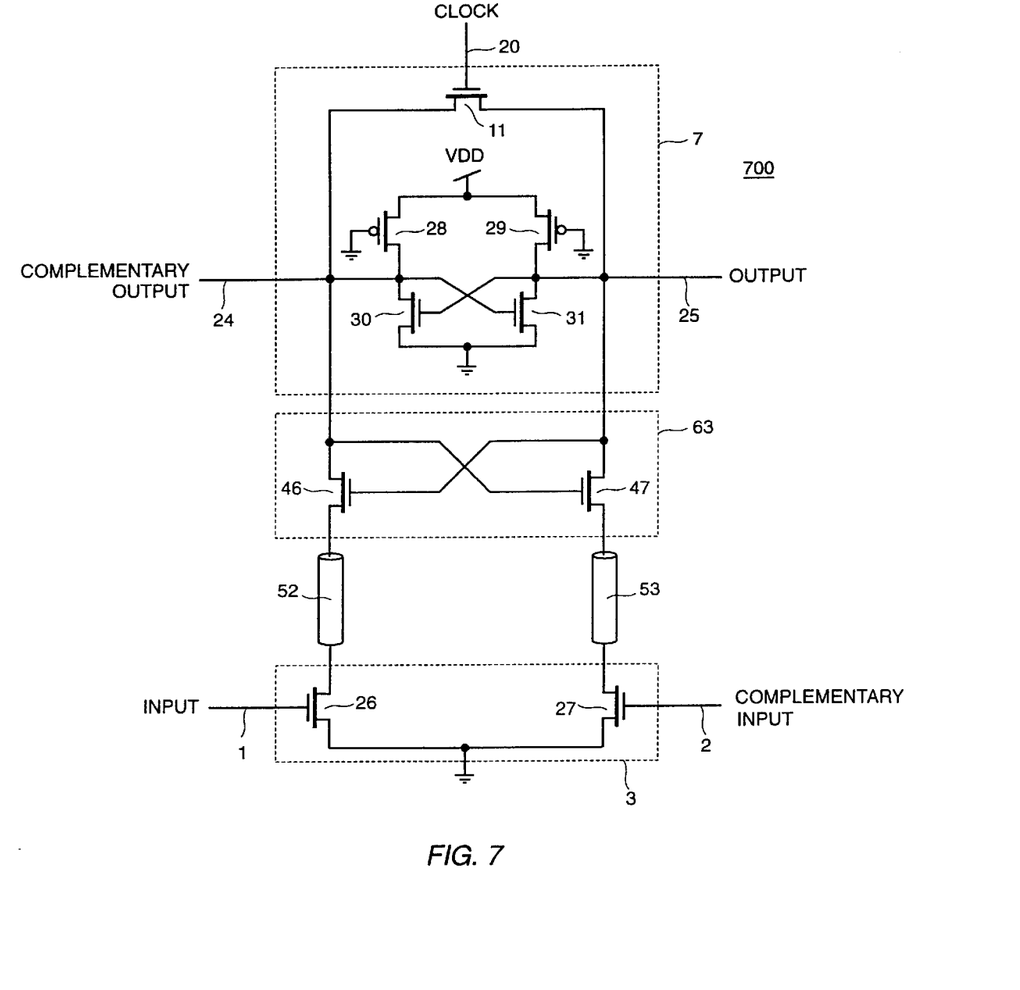
FIG. 7 shows an example of an input and output circuit comprising an off-chip driver and an off-chip receiver.

Referring to FIG. 7, it illustrates a combination of SDL driver and receiver pair 700. The circuit 700 has a differential switch 3 (shown as a single pole double throw switch) performing the function of a driver, and a receiver composed of an isolation circuit 63 and a synchronous sense latch 7. The circuit 700 further comprises an input 1, a complementary input 2, an output 25, a complementary output 24, a clock input 20, and two power supply ports VDD and ground. It is worth noting that all FETs have a fourth terminal which is known in the prior art as body. Herein, bodies of all PFETs are connected (not shown) to VDD and bodies of all NFETs are connected (not shown) to power supply port the ground.

The differential switch 3 is identical in configuration to the differential switch 3 of FIG. 4. The isolation circuit 63 of FIG. 7 is identical in configuration to the isolation circuit of FIG. 6. The sense latch 7 of FIG. 7 has the same configuration as that of the sense latch 7 shown in FIG. 4. A pair of controlled impedance transmission lines 52, 53 are used to connect the driver 3 to the receiver circuit composed of isolation transistors 63 and latching sense amplifier 7. The driver may be located on one chip and the receiver on a different chip or alternately they may reside on the same chip. The transmission line may be of the LC type or RC type. The former is usually employed for interchip connections while the latter is used for intrachip connections.

In operation, the SDL latch 700 is provided with a voltage VDD and with a ground connection. Voltage VDD is positive in respect to the ground. In one phase, circuit 700 is equalized when the clock signal applied to the gate 20 of transistor 11 is high and in another phase it is evaluated when the clock is low. In the equalization phase, both outputs 24 and 25 are forced by the transistor 11 to a voltage which approximately equal to one half of the power supply voltage. During the equalization phase, the differential inputs 1 and 2 are allowed to change and the differential switch 3 closes either path 4 or path 5 to the ground. When the differential inputs 1 and 2 are such that the differential switch closes path 5 to the ground and leaves path 4 open then, when the clock change from equalization to evaluation, the output 25 will be pulled down toward the ground and the output 24 will be pulled up toward VDD. The size (width and length) of equalization transistor 11 is purposely selected such that when circuit 700 operates at its maximum frequency, the voltages at 24 and 25 are not released to reach either voltage VDD or the ground. Moreover, the size of equalization transistor 11 is selected such that at the maximum operating frequency, the other transistors of logic circuit 700 are switched between a less-conducting and a more-conducting condition instead of being switched between an off (non-conducting) and an on (conducting) condition, as in the referenced prior art.

Through the use of SDL circuit structure depicted in FIGS. 2–7 and their mode of operation, a number of not immediately obvious advantages are achieved due to a combination of features: (a) small voltage swings, (b) operation of transistors above their threshold voltage, (c) precharging output nodes to a voltage approximately equal to half of the power supply voltage.

The first of these advantages is a substantial decrease of switching time. A lower voltage swing speeds up the operation because little time is lost in reversing the charges of circuit capacitances. Operating a transistor with voltage levels higher than the threshold voltage increases its transconductance (current carrying capability) and therefore shortens the time requires to charge or discharge capacitances. Forcing the sense latch to the middle point of the power supply voltage during the equalization phase, biases the cross-coupled inverters to their most sensitive operating point from which a small differential current is sufficient to imbalance the sense latch and therefore it switches in a very short time. Moreover, this equalization method reduces by one-half the transition time of the output data signals because they only have to switch from the middle point of the power supply to a stable logic level.

The second advantage results from operating the transistors above their threshold voltage (they are not turned off). Therefore, the current through the SDL circuit is not switched off and a nearly constant amount of current is switched from one current path of the differential circuit to another. Consequently, the SDL circuit presents an essentially constant load to the power supply.

The third advantage is that switching noise caused by charging and discharging of circuit capacitances is substantially reduced. Instead of charging parasitic capacitances from the positive power supply bus and discharging them into the negative bus, the equalization transistor transfers a large amount of charge from one output to its complement output during the equalization phase.

Although the invention has been described in terms of the specific embodiments, various modifications can be made without departing from the scope of the invention. For example, the detailed circuits have been shown as implemented with IGFET (Insulated Gate Field Effect Transistor) types of transistors, however, other types of transistors such as JFET (Junction Field Effect Transistor), BJT (Bipolar Junction Transistor), or a combination thereof can be used.

The above described embodiments of the present invention are merely descriptive of its principles and are not to be considered limiting. The scope of the present invention instead shall be determined from the scope of the following claims including their equivalents.

What is claimed is:

1. A synchronous differential logic circuit, comprising:
   a continuous power source having first and second terminals;
   a synchronous latching sense amplifier including a first inverter having an input and output, a second inverter having an input coupled to the output of the first inverter and output coupled to the input of the first inverter, and an equalization switch for coupling together the outputs of the first and second inverters, each of said first and second inverters being connected directly across the first and second terminals of the continuous power source so that said first and second inverters draw current from said continuous power source when the outputs of the first and second inverters are coupled together by the equalization switch; and
   a differential switch for coupling one of the inputs of the first and second inverters to one of the terminals of the continuous power source in response to a differential input.

2. The circuit of claim 1 wherein said first inverter comprises a first field effect transistor (FET), and said second inverter comprises a second FET.

3. The circuit of claim 2 wherein said first FET comprises a gate, source and drain, and said second FET comprises a gate coupled to the drain of the first FET, a source coupled to the source of the first FET, and a drain coupled to the gate of the first FET, the sources of the first and second FETs being directly connected to the first terminal of the continuous power source.

4. The circuit of claim 3 wherein the drain of the first FET is coupled to the second terminal of the continuous power source through a first pull-up device, and the drain of the second inverter is coupled to the second terminal of the continuous power source through a second pull-up device.

5. The circuit of claim 4 wherein each of the first and second pull-up devices comprises a FET, said FETs being continuously biased in the conductive mode.

6. The circuit of claim 1 wherein the equalization switch comprises a transistor.

7. The circuit of claim 6 wherein the equalization switch comprises a FET.

8. The circuit of claim 1 further comprising an isolation circuit disposed between the synchronous latching sense amplifier and the differential switch.

9. The circuit of claim 8 further comprising a controlled impedance transmission line disposed between the differential switch and the isolation circuit.

10. A synchronous differential logic circuit, comprising:
    a continuous power source having first and second terminals;
    a synchronous latching sense amplifier including a first inverter having an input and output, a second inverter having an input coupled to the output of the first inverter and output coupled to the input of the first inverter, and an equalization switch for coupling together the outputs of the first and second inverters, each of said first and second inverters being connected directly across the first and second terminals of the continuous power source so that said first and second inverters draw current from said continuous power source when the outputs of the first and second inverters are coupled together by the equalization switch; and
    a differential logic circuit for generating first and second outputs in response to a differential input, said first output of the differential logic circuit being coupled to the input of the first inverter and said second output of the differential logic circuit being coupled to the input of the second inverter.

11. The circuit of claim 10 wherein said first inverter comprises a first FET, and said second inverter comprises a second FET.

12. The circuit of claim 11 wherein said first FET comprises a gate, source and drain, and said second FET comprises a gate coupled to the drain of the first FET, a source coupled to the source of the first FET, and a drain coupled to the gate of the first FET, the sources of the first and second FETs being directly connected to the first terminal of the continuous power source.

13. The circuit of claim 12 wherein the drain of the first FET is coupled to the second terminal of the source the power source through a first pull-up device, and the drain of the second inverter is coupled to the second terminal of the continuous power source through a second pull-up device.

14. The circuit of claim 13 wherein each of the first and second pull-up devices comprises a FET, said FETs being continuously biased in the conductive mode.

15. The circuit of claim 10 wherein the equalization switch comprises a FET.

16. The circuit of claim 10 wherein the differential logic circuit comprises a first FET having a gate coupled to said one of the differential inputs, a source coupled to the first terminal of the continuous power source, and a drain coupled to the first output of the differential logic circuit, and a second FET having a gate coupled to said other one of the differential inputs, a source coupled to the first terminal of the continuous power source, and a drain coupled to the second output of the differential logic circuit.

17. The circuit of claim 10 wherein said differential logic circuit comprises an AND gate.

18. The circuit of claim 10 wherein said differential logic circuit comprises an OR gate.

19. The circuit of claim 10 wherein said differential logic circuit comprises an exclusive-OR gate.

20. The circuit of claim 10 wherein said differential logic circuit comprises a multiplexer.

21. The circuit of claim 10 further comprising an isolation circuit disposed between the synchronous latching sense amplifier and the differential logic circuit.

22. The circuit of claim 21 further comprising a controlled impedance transmission line disposed between the differential logic circuit and the isolation circuit.

23. A synchronous differential logic circuit adapted for connection to a power source having a voltage output and a voltage output return, comprising:
a differential logic circuit for producing first and second outputs in response to a differential input; and
a synchronous latching sense amplifier including a first inverter having an input coupled to the first output of the differential logic circuit and an output coupled to the second output of the differential logic circuit, a second inverter having an input coupled to the output of the first inverter and an output coupled to the input of the first inverter, and an equalization switch for equalizing the voltage of the outputs of the first and second inverters to approximately one-half the difference between the voltage output and the voltage output return.

24. The circuit of claim 23 further comprising a continuous power source having a voltage output and a voltage output return, each of said first and second inverters being connected directly across the voltage output and the voltage output return so that said first and second inverters draw current from said continuous power source when the voltage outputs of the first and second inverters are equalized.

25. The circuit of claim 23 wherein said first inverter comprises a first FET, and said second inverter comprises a second FET.

26. The circuit of claim 25 wherein said first FET comprises a gate, source and drain, and said second FET comprises a gate coupled to the drain of the first FET, a source coupled to the source of the first FET, and a drain coupled to the gate of the first FET, the sources of the first and second FETs being directly connected to the first terminal of the continuous power source.

27. The circuit of claim 26 wherein the drain of the first FET is coupled to the second terminal of the continuous power source through a first pull-up device, and the drain of the second inverter is coupled to the second terminal of the continuous power source through a second pull-up device.

28. The circuit of claim 27 wherein each of the first and second pull-up devices comprises a FET, said FETs being continuously biased in the conductive mode.

29. The circuit of claim 23 wherein the equalization switch comprises a FET.

30. The circuit of claim 23 wherein the differential logic circuit comprises a first FET having a gate coupled to said one of the differential inputs, a source coupled to the first terminal of the continuous power source, and a drain coupled to the first output of the differential logic circuit, and a second FET having a gate coupled to said other one of the differential inputs, a source coupled to the first terminal of the continuous power source, and a drain coupled to the second output of the differential logic circuit.

31. A synchronous differential logic system, comprising:
a synchronous differential logic circuit having:
first and second power supply terminals,
a clock input terminal for receiving a clock signal,
first and second differential data input terminals for receiving complementary data input signals,
first and second differential data output terminals for producing complementary data output signals in response to said complementary data input signals,
a differential logic switch connected between said differential data input terminals and said differential data output terminals for providing a conduction path between one of said differential output terminals and said second power supply terminal in response to said complementary data input signals,
a first inverting amplifier having an input connected to said first differential data output terminal and an output connected to said second differential output terminal, a first power port directly connected to said first power supply terminal, and a second power port directly connected to said second power supply terminal,
a second inverting amplifier having an input connected to said second differential data output terminal, and an output connected to said first differential data output terminal, a first power port directly connected to said first power supply terminal, and a second power port directly connected to said second power supply terminal, and
a clocked device having a first electrode connected to said first differential data output terminal, a second electrode connected to said second differential data output terminal, and a third electrode connected to said clock input terminal for providing a conduction path between said first electrode and said second electrode in response to a clock signal applied at said third electrode; and
a continuous power source connected directly across the first and second power supply terminals of the synchronous differential logic circuit so that said first and second amplifying inverters draw current from the continuous power source when a conduction path between the first and second electrodes of the clocked device is provided the clock signal applied to the third electrode.

32. The synchronous logic system of claim 31 wherein said differential data outputs are maintained at approximately one-half the potential applied by the continuous power source between the first and second power supply terminals of the synchronous differential logic circuit when the conduction path between the first and second electrodes of the clock device is provided by the clock signal applied to the third electrode.

33. The synchronous logic system of claim 31 wherein said differential logic switch comprises first and second n-channel FETs (NFET) each having a gate, source and drain, the drain of the first NFET being connected to the first differential data output terminal, the source of the first NFET being connected to the second power supply terminal, the gate of the first NFET being connected to the first differential data input terminal, the drain of the second NFET being connected to the second differential data output terminal, the source of the second NFET being connected to the second power supply terminal, and the gate of the second NFET being connected to the second differential data input terminal, and wherein said clocked device comprises a third NFET having a drain connected to the first differential data output terminal, a source connected to the second differential data output terminal, and a gate connected to the clock input terminal, and wherein said first and inverter comprises a fourth NFET and said second inverter comprises a fifth NFET, respectively, each of said fourth and fifth NFETs having a drain, source and gate, wherein the drain of said fourth NFET is connected to said first differential data output terminal, the source of said fourth NFET is connected directly to said second power supply terminal, the gate of said fourth NFET is connected to said second differential data output terminal, the drain of said fifth NFET is connected to said second differential data output terminal, the source of said fifth NFET is connected directly to said second power supply terminal, and the gate of said fifth NFET is connected to said first differential data input terminal, said first inverter further comprises a first p-channel FET (PFET) and said second inverter further comprises a second PFET, each of said PFETs having source and drain electrodes defining ends of a conductivity path and a gate electrode for controlling the conductivity of the path, said drain of said first PFET being connected to said first differential data output terminal, the source of said first PFET being connected directly to said first power supply terminal, the gate of said first PFET being connected to said second power supply terminal, said drain of said second PFET being connected to said second differential output terminal, the source of said second PFET being connected directly to said first power supply terminal, and the gate of said second PFET being connected to said second power supply terminal.

34. The synchronous logic system of claim 31 wherein said differential data input terminals comprise first, second, third, fourth, fifth, and sixth data input terminals, said differential logic switch comprises first, second, third, fourth, fifth, and sixth NFETs, said first inverter comprises a seventh NFET, said second inverter comprises an eighth NFET, and said clocked device comprise a ninth NFET, each of said NFETs having a drain, source and gate, wherein the drain of said first NFET is connected to said first differential data output terminal, the source of said first NFET is connected to the drain of the second NFET, the gate of said first NFET is connected to the first data input terminal, the source of the second NFET is connected to the second power supply terminal, the gate of the second NFET is connected to the second data input terminal, the drain of the third NFET is connected to the second differential data output terminal, the source of the third NFET is connected to the drain of the fourth NFET, the gate of the third NFET is connected to the third data input terminal, the source of the fourth NFET is connected to the second power supply terminal, the gate of the fourth NFET is connected to the fourth data input terminal, the drain of the fifth NFET is connected to the second differential data output terminal, the source of the fifth NFET is connected to the drain of the second NFET, the gate of the fifth NFET is connected to the fifth data input terminal, the drain of the sixth NFET is connected to the first differential data output terminal, the source of the sixth NFET is connected to the drain of the fourth NFET, the gate of the sixth NFET is connected to the sixth data input terminal, the drain of the seventh NFET is connected to said first differential data output terminal, the source of said seventh NFET is connected directly to said second power supply terminal, the gate of said seventh NFET is connected to said second differential data output terminal, the drain of the eighth NFET is connected to said second differential data output terminal, the source of said eighth NFET is connected directly to said second power supply terminal, the gate of said eighth NFET is connected to said first differential data output terminal, the drain of said ninth NFET is connected to said first differential output terminal, the source of said ninth NFET is connected to said second differential data output terminal, and the gate of said ninth NFET is connected to said clock input terminal, said first inverter further comprising a first PFET and said second inverter further comprising a seventh PFET, each PFET having source and drain electrodes defining the ends of a conductivity path and a gate electrode for controlling the conductivity of the path, said drain of said first PFET being connected to said first differential data output terminal, the source of said first PFET being connected directly to said first power supply terminal, the gate of said first PFET being connected to said second power supply terminal, the drain of said second PFET being connected to said second differential data output terminal, the source of said second PFET being connected directly to said first power supply terminal, and the gate of said second PFET transistor being connected to said second power supply terminal.

35. A synchronous differential logic system, comprising:
a synchronous differential logic circuit having:
first and second power supply terminals,
a clock input terminal for receiving a clock signal;
first and second differential data input terminals for receiving complementary data input signals,
first and second differential data output terminals for producing complementary data output signals in response to said complementary data input signals,
a differential logic switch having third and fourth output terminals for providing a conduction path between one of said third and fourth output terminals and said second power supply terminal in response to said complementary data input signals,
a first inverting amplifier having an input connected to said first differential data output terminal, an output connected to said second differential data output terminal, a first power port directly connected to said first power supply terminal, and a second power port directly connected to said second power supply terminal, a second inverting amplifier having an input connected to said second differential data output terminal, an output connected to said first differential data output terminal, a first power port directly connected to said first power supply terminal, and a second power port directly connected to said second power supply terminal, a clocked device having a first electrode connected to said first differential data output terminal, a second electrode connected to said second differential data output terminal, and a third electrode connected to said clock input terminal for providing a conduction path between said first electrode and said second electrode in response to a clock signal applied at said third electrode, and first and second NFETs, each NFET having source and drain electrodes defining ends of a conductivity path and a gate electrode for controlling the conductivity of the path, said drain of said first NFET being connected to said first differential data output terminal, the source of said first NFET being connected to third output terminal of the differential logic switch, the gate of said first NFET being connected to said second differential data output terminal, the drain of said second NFET being connected to said second differential data output terminal, the source of said second NFET being connected to said fourth output terminal of the differential logic switch, and the gate of said second NFET being connected to said first differential data output terminal; and a continuous power source connected directly across the first and second power supply terminals of the synchronous differential logic circuit so that said first and second amplifying inverters draw current from the continuous power source when a conduction path between the first and second electrodes of the clocked device is provided by the clock signal applied to the third electrode.

36. A synchronous differential logic system, comprising:
a synchronous differential logic circuit having:
  first and second power supply terminals,
  a clock input terminal for receiving a clock signal;
  first and second differential data input terminals for receiving complementary data input signals;
  first and second differential data output terminals for producing complementary data output signals in response to said complementary data input signals;
  a differential logic switch having third and fourth output terminals for providing a conduction path between one of said third and fourth output terminals and said second power supply terminal in response to said complementary data input signals;
  a first inverting amplifier having an input connected to said first differential data output terminal, an output connected to said second differential data output terminal, a first power port directly connected to said first power supply terminal, and a second power port directly connected to said second power supply terminal;
  a second inverting amplifier having an input connected to said second differential data output terminal, an output connected to said first differential data output terminal, a first power port directly connected to said first power supply terminal, and a second power port directly connected to said second power supply terminal;
  a clocked device having a first electrode connected to said first differential data output terminal, a second electrode connected to said second differential data output terminal, and a third electrode connected to said clock input terminal for providing a conduction path between said first electrode and said second electrode in response to a clock signal applied at said third electrode;
  a first transmission line having an end connected to the third output terminal of the differential logic switch;
  a second transmission line having an end connected to the fourth output terminal of the differential logic switch;
  first and second NFETs, each NFET having source and drain electrodes defining ends of a conductivity path and a gate electrode for controlling the conductivity of the path, said drain of said first NFET being connected to said first differential data output terminal, the source of said first NFET being connected to the other end of said first transmission line, the gate of said first NFET being connected to said second differential data output terminal, the drain of said second NFET being connected to said second differential data output terminal, the source of said second NFET being connected to the other end of the second transmission line, and the gate of said second NFET being connected to said first differential data output terminal; and
  a continuous power source connected directly across the first and second power supply terminals of the synchronous differential logic circuit so that said first and second amplifying inverters draw current from the continuous power source when a conduction path between the first and second electrodes of the clocked device is provided by the clock signal applied to the third electrode.

37. The synchronous logic system of claim 36 wherein said differential logic switch comprises third and fourth NFETs each having a gate, source and drain, the drain of the third NFET being connected to the end of the first transmission line, the source of the third NFET being connected to the second power supply terminal, the gate of the third NFET being connected to the first differential data input terminal, the drain of the fourth NFET being connected to the end of the second transmission line, the source of the fourth NFET being connected to the second power supply terminal, and the gate of the fourth NFET being connected to the second differential data input terminal, and wherein said clocked device comprises a fifth NFET having a drain connected to the first differential data output terminal, a source connected to the second differential data output terminal, and a gate connected to the clock input terminal, and wherein said first inverter comprises a sixth NFET and said second invention comprises a seventh NFET, respectively, each of said fourth and fifth NFETs having a drain, source and gate, wherein the drain of said sixth NFET is connected to said first differential data output terminal, the source of said sixth NFET is connected to said second power supply terminal, the gate of said sixth NFET is connected to said second differential data output terminal, the drain of said seventh NFET is connected to said second differential data output terminal, the source of said seventh NFET is connected to said second power supply terminal, and the gate of said seventh NFET is connected to said first differ ential input terminal, said first inverter further comprises a first PFET and said second invention further comprises a second PFET, each of said PFETs having source and drain electrodes defining ends of a conductivity path and a gate electrode for controlling the conductivity of the path, said drain of said first PFET being connected to said first differential output terminal, the source of said first PFET being connected to said first power supply terminal, the gate of said first PFET being connected to said second power supply terminal, said drain of said second PFET being connected to said second differential output terminal, the source of said second PFET being connected to said first power supply terminal, and the gate of said second PFET being connected to said second power supply terminal.

* * * * *